United States Patent [19]

Yoneda

[11] Patent Number: 5,987,236
[45] Date of Patent: Nov. 16, 1999

[54] CHARGED PARTICLE TRAJECTORY ANALYSIS THROUGH ELEMENT ANALYSIS

[75] Inventor: Ko Yoneda, Yokohama, Japan

[73] Assignee: Canon Kabushiki Kaisha, Tokyo, Japan

[21] Appl. No.: 08/551,864

[22] Filed: Nov. 22, 1995

[30] Foreign Application Priority Data

Nov. 22, 1994 [JP] Japan .................................. 6-288335

[51] Int. Cl.⁶ .................................................. G06F 9/455
[52] U.S. Cl. ............................................................. 395/500
[58] Field of Search ............................. 324/72; 607/154; 364/553, 578; 128/644; 395/500

[56] References Cited

PUBLICATIONS

Analysis of Discontinuities in an Asymmetric Dielectric Slab Waveguide by Combination of Finite and Boundary Elements, Hirayama and Koshiba, Apr. 1992.

*Primary Examiner*—Kevin J. Teska
*Assistant Examiner*—Dan Fiul
*Attorney, Agent, or Firm*—Fitzpatrick, Cella, Harper & Scinto

[57] ABSTRACT

A method for obtaining a solution for a structure to be analyzed is disclosed. The method operates by dividing the structure into two or more substructures, and preparing at least two different calculation techniques for calculating a solution for each of the substructures from boundary conditions. One of the calculation techniques is selected separately for each of the substructures according to characteristics of analysis conditions corresponding to each of the substructures. A solution is separately calculated for each of the substructures according to boundary conditions by using the selected calculation technique, until the solutions for all of the substructures fall within respective ranges that are predetermined in accordance with each of the substructures. The set of solutions for the substructures is then used as the solution for the structure. A corresponding system and computer program are also disclosed.

11 Claims, 12 Drawing Sheets

CHARGED PARTICLE TRAJECTORY ANALYSIS THROUGH ELEMENT ANALYSIS

BACKGROUND OF THE INVENTION

1. Field of the Invention

The present invention relates to a substructuring method for use, especially, in analysis of a large scale field, by which a field quantity corresponding to a structure is analyzed by dividing the structure into two or more substructures and calculating a solution respectively corresponding to the substructures separately.

2. Description of the Related Art

Hitherto, various kinds of devices, which use electron beams and ion beams, have been put to practical use. Each of these devices guides charged particles by using an electric field and a magnetic field and utilizes the charged particles for a predetermined purpose. An example of such an electron-beam device is illustrated in FIG. 9. In this figure, reference numerals 101 to 106 designate electrodes, to each of which a predetermined potential is provided. Thus a predetermined electric field (distribution) is formed in a space 200. Further, in the case of this example, a predetermined magnetic field is applied in an α-β direction. Moreover, each of the electrodes 101 to 106 has a nearly rotationally symmetric shape with respect to an axis α-β. Furthermore, the device is constructed in such a manner that electrons are emitted from an end portion 107 of the electrode 106. An emitted electrode moves in a trajectory designated by reference numeral 190 under the influence of forces caused by the electric and magnetic fields.

The control of a trajectory of a charged particle is important in designing such a device. Moreover, it is necessary for such a control operation to predict a trajectory of a charged particle by performing a numerical simulation. Roughly speaking, each numerical simulation consists of (1) the step of calculating field quantities corresponding to an electric field and a magnetic field and (2) the step of computing a motion of the charged particle.

The calculation of a field quantity is performed by using, for example, the finite element method, the boundary element method or the integral equation method. On the other hand, the computing of a motion of a charged particle is performed by using a method of calculating the distance traveled by the charged particle and the travelling speed of the charged particle in sequence every finite period $\Delta t$. There are various kinds of such methods. Further, a typical example of such methods is the Runge-Kutta method. Furthermore, such methods are named generically as a time integral method.

Next, a method of calculating an electric field (distribution) in a space 200 of FIG. 9 will be described hereinbelow. Further, each of the electrodes 101 to 106 is at a fixed potential. Moreover, on boundaries 121 to 125, the normal component of the electric field can be regarded as being approximately equal to 0. Such a boundary condition can be used without degrading the precision of calculating the electric field in the vicinity of the trajectory 190 of an electron.

In the case of using the finite element method in the calculation of the electric field, the interior of the space 200 is first divided into elements of small volume. Next, the predetermined values of the potentials are given to the electrodes 101 to 106 as known quantities. Further, zero is given to each of the other boundaries 121 to 125 as the value of the normal component of (the intensity of) the electric field. When performing finite element calculations in this way, the value of the potential at each of nodes of elements are obtained. According to the finite element method, the distribution of the potential in each of the elements is represented by a predetermined function of the potentials of the nodes of the corresponding element. The value of the intensity of the electric field, therefore, can be obtained by differentiating this intra-element function with respect to the position. Consequently, as long as a particle is within the space 200, the value of the intensity of the electric field at the position of this particle can be calculated.

However, high accuracy is sometimes needed for the calculation of the trajectory of a particle. In such cases, it is necessary to enhance both of the precision of calculating a field quantity corresponding to a field and that of computing the motion of a charged particle. Because of the fact that generally, the precision of calculating a field quantity is lower than that of computing the motion of a charged particle, the enhancement of the precision of calculating a field quantity becomes important. For that purpose, when performing the finite element method, the interior of the space has only to be divided further finely into elements. However, actually, there is a limit to the capability or throughput of a computer used for the calculation. Especially, storage or memory capacity, which is available for the calculation, imposes limitations on the magnitudes of field quantities to be calculated (or to the computational complexity). One of the methods for overcoming such limitations is the substructuring method.

The substructuring method is a method, by which a space to be analyzed is first divided into some substructures and next, one of the substructures is analyzed by applying the finite element method thereto, and finally, a solution to be found in the entire space is obtained by manipulating conditions established in each of the connecting portions among the substructures.

Next, the substructuring method will be specifically described hereinbelow by referring to FIG. 10. In this figure, reference numerals 101, 105, 106, 141 to 149 respectively denote electrodes; and 201 to 207 subspaces. Further, reference numerals 121 to 125 respectively designate boundaries between the entire space and the exterior, similarly as of the space of FIG. 9; and 131 to 136 boundaries between the subspaces into which the entire space is divided. The entire shape of the device is nearly rotationally symmetric with respect to an axis α-β, similarly as in the case of the device of FIG. 9. FIG. 10 is a sectional view of such a device.

Each of the substructures is formed as follows.

A first one of the substructures consists of the subspaces 201 and 202 and the boundaries 101, 106, 141, 142 and 132.

A second one of the substructures consists of the subspaces 202 to 204 and the boundaries 142 to 145, 123, 131 and 134.

A third one of the substructures consists of the subspaces 204 to 206 and the boundaries 145 to 148, 124, 133 and 136.

A fourth one of the substructures consists of the subspaces 206 and 207 and the boundaries 148, 149, 125, 135 and 105.

Therefore, the device of FIG. 10 is constituted by the four substructures. Each of the subspaces 202, 204 and 206 is an overlapping subspace between the adjoining substructures.

<Example of Calculation of Electric Field>

A process of calculating an electric field will be described hereinbelow by referring to a flowchart of FIG. 11.

The calculation is commenced in step S610. Next, in step S611, fixed boundary values, namely, the values of the potentials are set at nodes on the surfaces of the electrodes 101, 105, 106 and 141 to 149 as the fixed boundary values. Subsequently, in step S612, initial values are set at nodes on the boundaries 131 to 136 of the substructures. Here, the initial values are zero. However, in the case of the example of FIG. 10, the potential on the electrode in the vicinity of each of these boundaries may be set as the initial value to be set at a corresponding one of the nodes. Namely, the potentials on the electrodes 141 to 143 may be given to the nodes on the boundaries 131 and 132, respectively. Incidentally, as will be described later, practically, the initial values are not used. Thus, the setting of the initial values can be omitted. It is the same with the boundaries designated by reference numerals 133 and 135.

In the case of the calculation of a field (quantity) in one of the substructures to be step S613, first, such a calculation is performed on the first substructure (consisting of the subspaces) 201 and 202 according to the finite element method by using the boundaries 101, 106, 141, 142, 132, 121 and 122. Incidentally, in the cases of the boundaries 121 and 122, the boundary conditions are automatically met. Thus, it is unnecessary to set the initial values at the nodes on these boundaries 121 and 122.

In step S615, the value of the potential obtained as the result of the calculation performed on the first substructure is set at a node on the substructure boundary 131 contained in the first substructure. This means simply the replacement of the value at the node, because of the fact that the node in the overlapping subspace between the first and second substructures is common thereto.

A process consisting of steps S613 to S615 is performed on the first to fourth substructures in sequence. Next, such a process is again performed on the substructures by starting with the first substructure. In the aforementioned step S614, a judgment is made on midway convergence conditions in the repeated process. This judgment is performed so as to check the amount of the change in value of the potential at a node of a same substructure in a cycle of the repeated process, namely, the difference between the current value of the potential at the node and the preceding value thereof. Further, if the extent of the change in value of the potential at the node becomes sufficiently small, it is judged that the potential at the node has converged on the current value thereof. Moreover, if the convergence of the potentials at nodes is achieved in all of the substructures, it is judged that the potentials at the nodes has converged in the entire space to be analyzed. Then, the process or program exits from step S614 through a YES-branch to step S616 whereupon the calculation is finished.

<Example of Calculation of Trajectory>

Next, the procedure for calculating a trajectory of a charged particle will be described hereinbelow by referring to a flowchart of FIG. 12. Basically, this procedure is similar to that for calculating a trajectory of a charged particle in the case where the space to be analyzed has a single structure.

In step S620, the electric field is calculated. Namely, the electric field at each of all nodes is calculated according to the finite element method in this step. Then, the program advances to the next step.

In step S621, the value of the intensity of the electric field at each of the nodes is calculated. Further, the reason for calculating the value of the intensity of the electric field at each of the nodes is as follows. Here, it is assumed that the space to be analyzed is divided into elements as illustrated in FIG. 13 (incidentally, in this figure, the elements are shown as two-dimensional elements, for the simplicity of the description). The space of FIG. 13 is composed of elements 21 to 28 and nodes 11 to 19. Here, note that the electric field at an arbitrary point in the element 21 can be determined by the potentials at the nodes 11, 14 and 15 and an interpolation function defined in the element 21. The accuracy of calculating the electric field (distribution), however, becomes lower than that of calculating the potential field distribution. For example, in the case of a linear tetrahedron element, the value of the intensity of the electric field is constant therein but changes discontinuously on the boundaries thereof. This is extremely unnatural. Thus, if the value of the intensity of the electric field on each of the nodes is determined by some method and further, that of the intensity of the electric field in the element is obtained by interpolation from the values of the intensity of the electric field on each of the nodes. Thereby, the electric field can be further smoothly represented.

For instance, a method of defining the value of the intensity of the electric field at a node as the average of the values of the intensity of the electric field in an element containing a node is used as a method of calculating the value of the intensity of this node. If this method is applied to the space of FIG. 13, the value of the intensity of the electric field comes to be defined as the average of the values of the intensity of the electric field in the elements 21 to 23 and 26 to 28.

A loop S627 consisting of steps S622 to S624 is a portion or process for calculating the trajectory of a particle.

Further, reference character S622 designates a step in which the value of the intensity of the electric field at a position of a particle is calculated by interpolation by use of the values of the electric field at the nodes, which have been obtained in step S621, in the element. Then, in step S623, the equation of motion is solved. Moreover, the position and speed of the particle at a point of time when an infinitesimal time $\Delta t$ has passed thence are computed. During a subprocess containing steps S622 and S623 and a path or branch P626 is repeatedly performed, the calculation corresponding to the particle is finished in step S624 when the particle reaches the final position thereof. Then, the program passes or moves on to the calculation of the trajectory of the next particle. When the calculation of the trajectories of all of the particles is finished, the procedure for calculating the trajectory is finished and the program advances to step S625.

<Example of Space-Charge Effects>

In the foregoing description, the calculation of the trajectories has been described. However, there is a problem to be discussed, which is left unmentioned, namely, a problem of a space-charge effect. Thus, the space-charge effect will be described hereinafter.

The space-charge effect is generally defined as a phenomenon in which the charge of a charged particle moving in a space causes an electric field. Namely, this means that when a charged particle is generated, the electric field (distribution) is changed from that produced only by the electrodes when there is no charge particle. This effect is large in a charged-particle emitting portion in which the speed of a charged particle is low, namely, in the proximity of the electron emitting portion 107 in the case of the device of FIG. 9. This effect becomes an important factor which not only causes the trajectory of the particle but also determines an emission current (incidentally, in the case of a field emission, the electric field occurring in the emitting portion changes owing to the presence of space charge and thus affects the emission current density directly). Therefore, it is necessary to calculate the trajectory of a charged particle by taking this effect into account.

A calculation procedure for performing the calculation in such a way will be described hereinbelow by referring to a flowchart of FIG. 14.

The calculation is started in step S630. Next, in step S631, the calculation of the electric field is performed. Here, note that if the influence or effect of a magnetic field caused by the motion of a charged particle can be neglected, the magnetic field does not affect the trajectory of a charged particle. Thus, it is sufficient to perform the calculation only one time. Then, in step S632, the trajectory of the charged particle is calculated.

Subsequently, if it is judged in step S633 that the value does not converge, the program advances to step S634 whereupon the space-charge distribution is calculated by using information concerning the position and speed of the charged particle. Next, the program returns through a path or branch P636 to step S631 whereupon the electric field is calculated again by using the space-charge density distribution which has been computed in step S634. Thereafter, the process consisting of steps S631 to S634 is repeated.

During repeating such a process, it is judged in midway step S633 whether or not the calculated values of the trajectory and so on have converged. If the convergence conditions are satisfied (namely, it is judged in step S633 that the calculated values have converged), the program exits therefrom to step S635 in which the calculation is then finished. Incidentally, in step S633, in the case where the trajectory of the charged particle, the value of the speed thereof and the value of the intensity of the electric field come to be able to be regarded as being unchanged, it is judged in step S633 that the calculated values have converged.

In the foregoing description, the conventional method of calculating the trajectory and so on of a charged particle placed in an electromagnetic field has been described. The conventional method, however, has encountered the following problems.

(1) In the case where high precision is required for the calculation of the trajectory of a charged particle, high accuracy is also required for the calculation of an electric field or a magnetic field. However, when performing the finite element method, an electric field (distribution) in an element is represented by a polynomial. Therefore, a large-scale analysis using the substructuring method is insufficient for accurately calculating the electric field (distribution).

(2) As the countermeasure to this, an analysis method, by which the electric field (distribution) can be further precisely represented or expressed, is considered to be employed. Examples of such an analysis method are the boundary element method and the integral equation method. Incidentally, these methods have problems in that the scale of an analysis becomes large and that the computational complexity, as well as the storage capacity used for the calculation, increases.

(3) Further, in the case where only one of such calculation techniques is employed, there is a drawback in that the accuracy of calculating the electric field in the neighborhood of a boundary, especially, in the vicinity of the electron emitting surface as designated by reference numeral 107 in FIG. 9 is low. Namely, the electric field occurring on the emission surface determines the emission current density and thus may cause a large error in the trajectory of a charged particle and in the amount of the emission current.

(4) Moreover, in the case where the space-charge effect is taken into consideration as described above, the space charge should be used in the calculation. In contrast with the finite element method by which a space is divided into elements and thus the electric charge distribution can be easily handled, the boundary element method and the integral equation method require special means or ideas for handling the electric charge distribution. Moreover, the boundary element method and the integral equation method have a defect in that if the handling of the electric charge distribution is inappropriate, the accuracy of calculating the electric field is degraded and thus such techniques lose their intrinsic advantage that the accuracy of calculating a field quantity is good.

The present invention is accomplished to eliminate the drawbacks of the conventional method.

SUMMARY OF THE INVENTION

Accordingly, an object of the present invention is to provide a substructuring method by which the accuracy of calculating a field quantity can be enhanced while the time required for calculating the field quantity can be reduced, by employing a technique suitable for calculating the field quantity correspondingly to each substructure.

Further, another object of the present invention is to provide a device for implementing such a substructuring method.

Moreover, still another object of the present invention is to provide a substructuring method suitable for predicting, for example, the trajectory of a charged particle.

Furthermore, yet another object of the present invention is to provide a device for implementing this substructuring method.

Additionally, a further object of the present invention is to provide a substructuring method by which a field quantity in the vicinity of a boundary can be calculated with good precision differently from the conventional method by which the field quantity in the vicinity of the boundary by the conventional device can be calculated with low precision.

Further, a still further object of the present invention is to provide a device for implementing this substructuring method.

Moreover, an additional object of the present invention is to provide a storage medium for storing a program code by which the substructuring method of the present invention is implemented.

To achieve the foregoing object, in accordance with an aspect of the present invention, there is provided a substructuring method for obtaining a resolution corresponding to a structure to be analyzed, by dividing the structure into two or more substructures and by subsequently calculating a solution corresponding to each of the substructures separately. This substructuring method (hereunder sometimes referred to as a first substructuring method) is characterized by comprising the step of preparing at least two different calculation techniques for calculating a solution corresponding to each of the substructures from boundary conditions, the step of selecting one of the calculation techniques according to characteristics of analysis conditions corresponding to each of the substructures and thereafter calculating the solution corresponding to each of the substructures according to predetermined boundary conditions and the step of determining the solution corresponding to each of the substructures as a solution corresponding to the structure in a case where the solution corresponding to each of the substructures converges on a value which is within a predetermined range.

Here, in the case of a practical embodiment (hereunder sometimes referred to as a second substructuring method) of the first substructuring method, the structure is divided into the substructures in such a manner that there is an overlapping portion between adjoining ones of the substructures. Further, in the case of a practical embodiment of the second substructuring method, the solution corresponding to each of the substructures is calculated by computing a boundary value of the field quantity on a boundary of the substructure, which is placed in the structure, from values thereof obtained in adjoining portions which contain the boundary of the substructure. Moreover, the solution corresponding to the structure is determined by repeatedly performing calculation of values of the field quantity in the substructure by using values obtained from a result of the computing as boundary values on boundaries of the portions. Thereby, a solution for the boundary value of the substructure is obtained in the structure. Furthermore, in the case of another practical embodiment of the first substructuring method, the different calculation techniques include the finite element method and the boundary element method. Alternatively, in the case of still another substructuring method, the different calculation techniques include the three-dimensional analysis technique and the axisymmetric three-dimensional analysis technique. Additionally, in the case of yet another practical embodiment of the first substructuring method, the solution corresponding to each of the substructures is calculated by setting a predetermined value in at least one of the substructures or in a part of the substructures. In addition, a further practical embodiment of the first substructuring method is used for calculating the trajectory of a charged particle.

Further, in accordance with another aspect of the present invention, there is provided a system for implementing the aforementioned substructuring method of the present invention. Namely, there is provided a system for obtaining a resolution corresponding to a structure to be analyzed, by dividing the structure into two or more substructures and by subsequently calculating a solution corresponding to each of the substructures separately. This system (hereunder sometimes referred to as a first substructuring system) comprises at least two different calculation means for calculating a solution corresponding to each of the substructures from boundary conditions, substructure calculating means for selecting one of the calculation means according to characteristics of analysis conditions corresponding to each of the substructures and for calculating the solution corresponding to each of the substructures according to predetermined boundary conditions, and determination means for determining the solution corresponding to each of the substructures as a solution corresponding to the structure in a case where the solution corresponding to each of the substructures converges on a value which is within a predetermined range.

Moreover, in the case of a practical embodiment of the first substructuring system, the substructure calculating means comprises boundary potential determining means for setting a potential on a fixed boundary and for determining a potential which is present on a boundary of one of the substructure, electric-field determining means for determining an electric field according to the potential set on the fixed boundary and the potential being present on the boundary of the substructure, and trajectory calculating means for calculating a trajectory of a charged particle according to information concerning the electric field and the charged particle, thereby calculating the trajectory of the charged particle in an electron or ion-beam device. Furthermore, in the case of another practical embodiment of the first substructuring system, the electric-field determining means determines an electric field according to the potential set on the fixed boundary, the determined potential on the boundary of the substructure and an electric charge of the charged particle.

BRIEF DESCRIPTION OF THE DRAWINGS

Other features, objects and advantages of the present invention will become apparent from the following description of preferred embodiments with reference to the drawings in which like reference characters designate like or corresponding parts throughout several views, and in which.

DETAILED DESCRIPTION OF THE PREFERRED EMBODIMENTS

Hereinafter, the preferred embodiments of the present invention will be described in detail by referring to the accompanying drawings.

<Example of Configuration of System Embodying The Present Invention>

Figure 1:
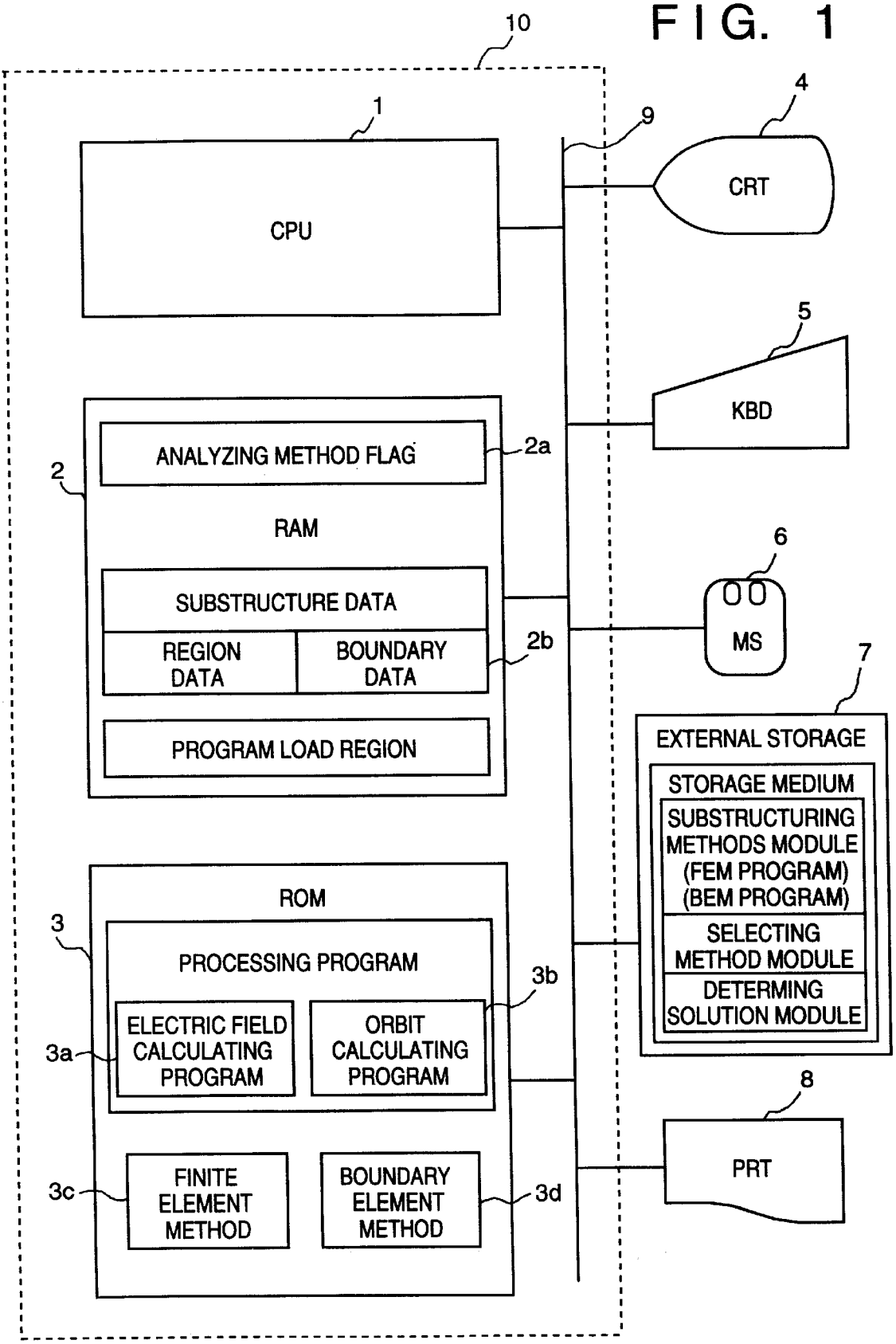
FIG. 1 is a schematic block diagram for illustrating the configuration of an example of the system (namely, Embodiment 1 of the present invention) for implementing a substructuring method embodying the present invention.

FIG. 1 is a schematic block diagram for illustrating the configuration of an example of the system (namely, Embodiment 1 of the present invention) for implementing a substructuring method according to the present invention.

In this figure, reference numeral 1 designates a central processing unit (CPU) for performing various operations such as an arithmetic operation and a control operation. Incidentally, this CPU 1 may be constituted by either of a single processor and a multi-processor. Further, reference numeral 2 denotes a random access memory (RAM) for storing transient information, into which data and a program are loaded from an external storage 7 such as a compact disk read-only memory (CD-ROM), a hard disk, a floppy disk or the like. In the case of this embodiment, the external storage 7 has a storage subspace for storing an analyzing method flag 2a, and another storage subspace for storing substructure data 2b which include space data and boundary data. Moreover, reference numeral 3 represents a ROM in which control programs and processing programs are stored. In the case of this embodiment, an electric field calculating program 3a to be executed for calculating the electric field present in a subspace according to values on boundaries thereof, a trajectory calculating program 3b to be executed for calculating the trajectory of a charge moving in the electric field, an analysis program 3c according to the finite element method, and another analysis program 3d according to the boundary element method are stored in this ROM. Reference numeral 4 designates a cathode-ray tube (CRT) for displaying log information, operator guidance or the like on the screen thereof for an operator. Further, reference numeral 5 denotes a keyboard used by an operator to input instructions, commands and so forth. Moreover, reference numeral 6 represents a pointing device such as a mouse, which is used by an operator for selecting a display and for providing directions; 8 a printer used for outputting a hard copy record of a result of an operation; and 9 a bus for connecting the body 10 of a computer (namely, a processing unit 10) with external equipment. Incidentally, the programs 3a to 3d stored in the ROM 3 may be executed on the RAM 2 by being loaded thereinto from the external storage 7. Hereinafter, an example of an analysis performed on an electron beam device by using this system, namely, Embodiment 1 will be described.

<System Analyzed by Embodiment 1>

Figure 3:
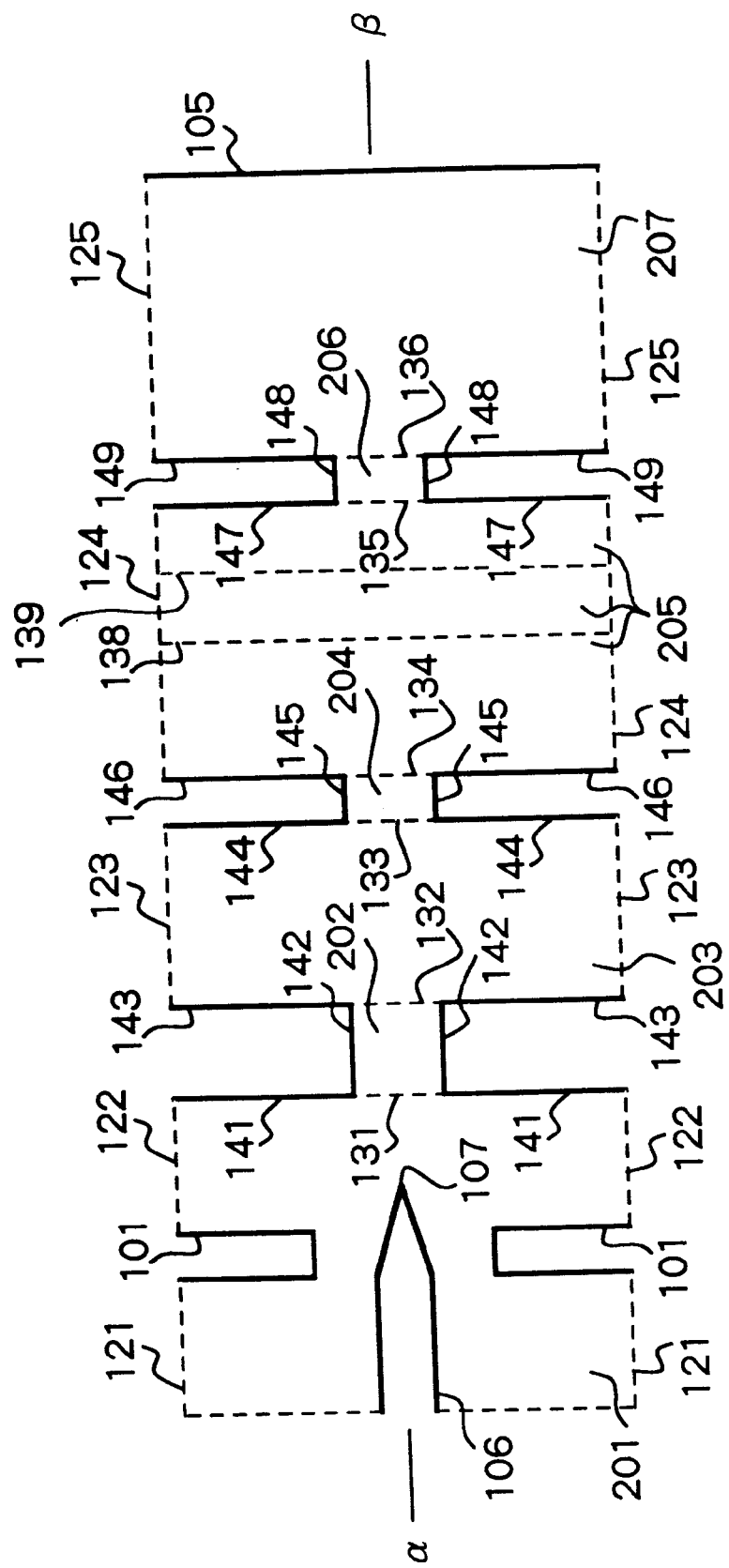
FIG. 3 is a diagram for illustrating an analysis model employed in Embodiment 1 of the present invention.

FIG. 3 illustrates a (model) system in the electron beam device to be analyzed by Embodiment 1. In this figure, reference numerals 101, 105, 106, 141 to 149 designate electrodes which compose an almost axisymmetric system with respect to an axis α-β. Further, reference numerals 201 to 207 denote subspaces to be analyzed, which are used for calculating an electric field in this system. Moreover, reference numerals 121 to 125 designate outer boundaries of these subspaces. Furthermore, reference numerals 131 to 136 represent boundaries of substructures used for calculating the electric field in this system.

In the case of this Embodiment 1, the (entire) space to be analyzed is divided into four substructures.

A first substructure consists of the subspaces 201 and 202 and has the boundaries 121, 122, 101, 106, 141, 142 and 132.

Further, a second substructure consists of the subspaces 202 to 204 and has the boundaries 123, 142 to 145, 131 and 134.

Moreover, a third substructure consists of the subspaces 204 to 206 and has the boundaries 124, 145 to 146, 133 and 136.

Furthermore, a fourth substructure consists of the subspaces 206 and 207 and has the boundaries 125, 148, 149, 135 and 105.

Figure 10:
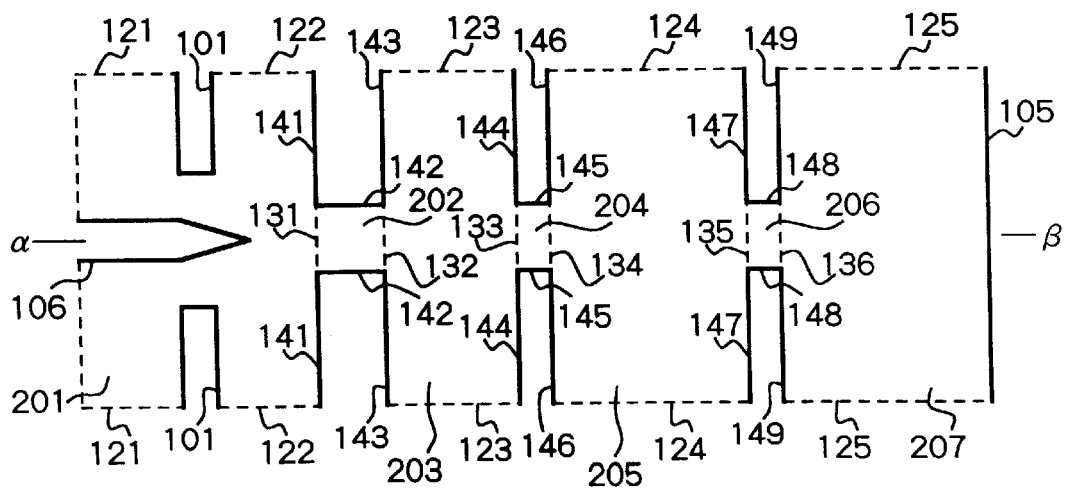
FIG. 10 is a diagram for illustrating an analysis model employed in the conventional device.
Figure 11:
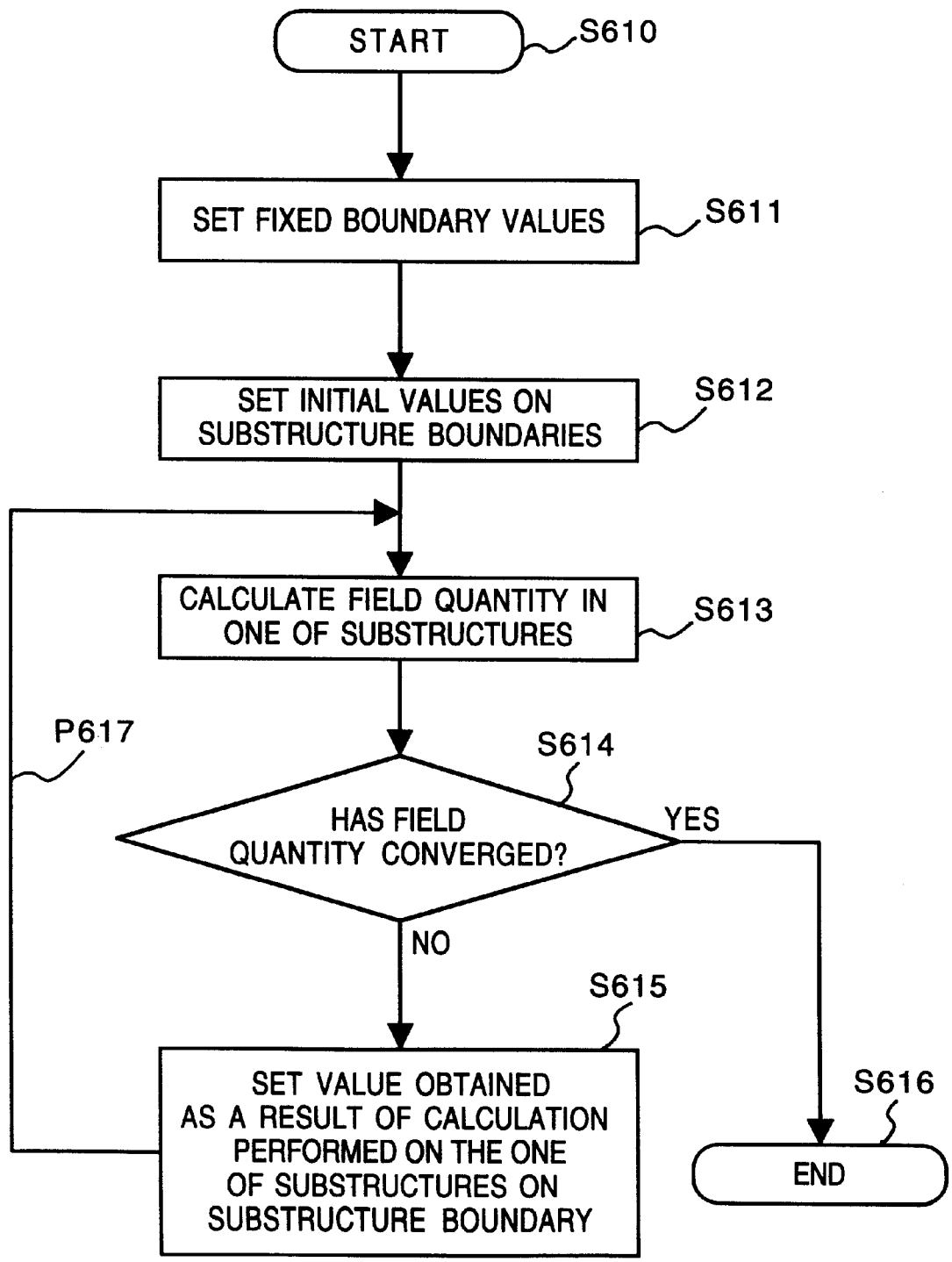
FIG. 11 is a flowchart for illustrating a process of calculating an electric field in the conventional device.
Figure 12:
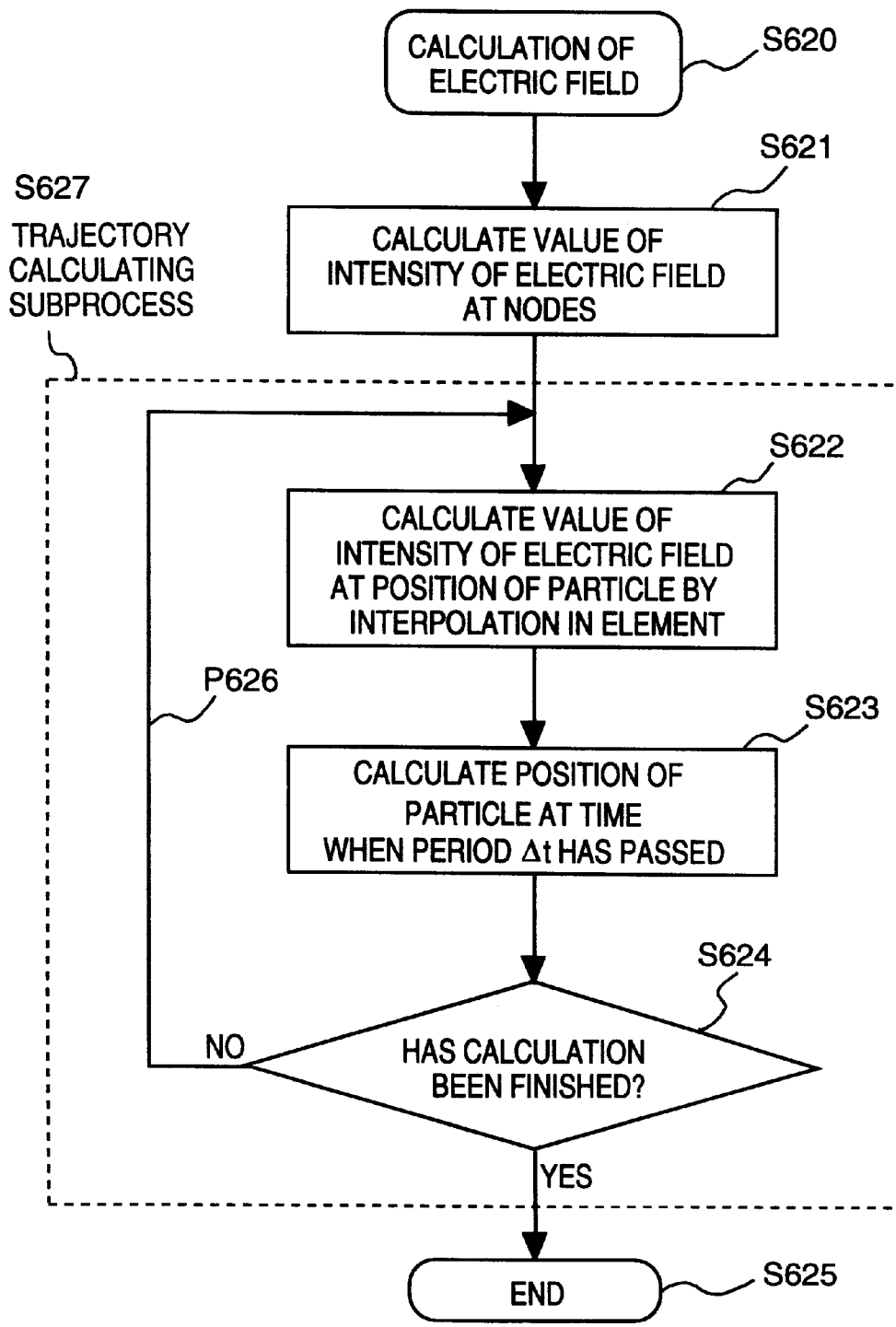
FIG. 12 is a flowchart for illustrating a procedure for calculating the trajectory of a charged particle in the conventional device.
Figure 13:
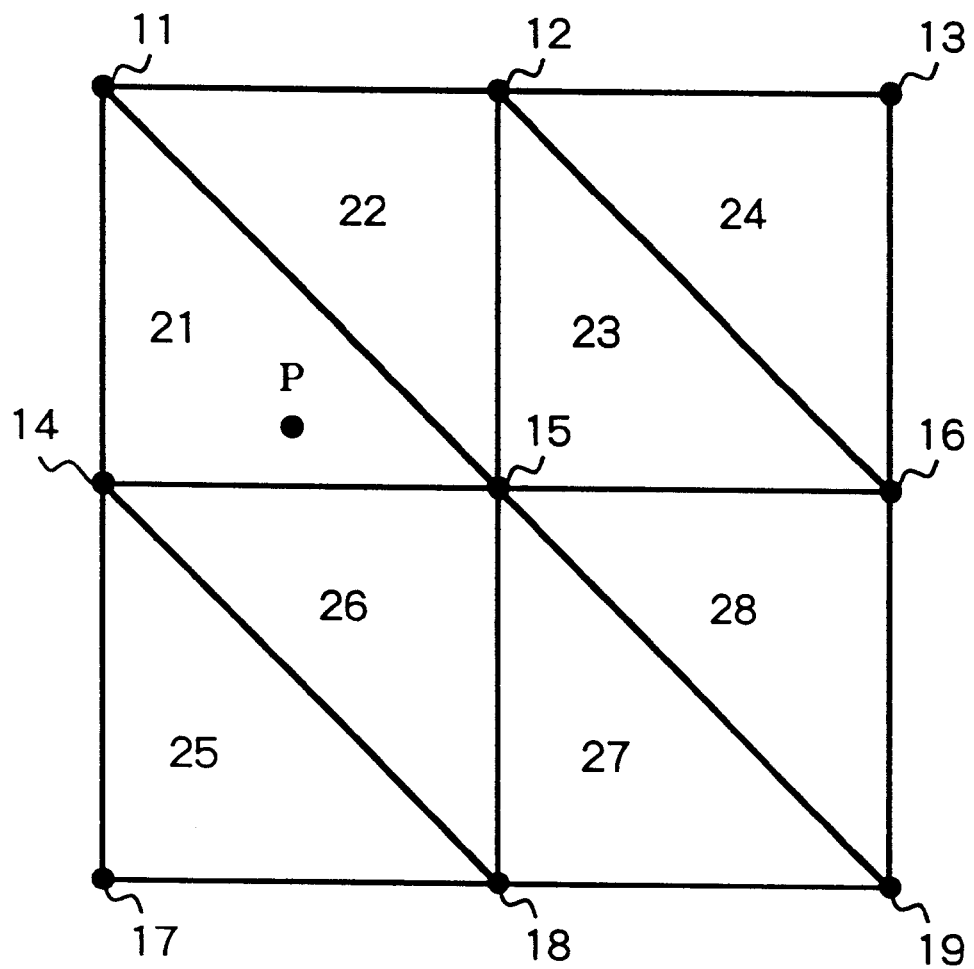
FIG. 13 is a diagram for illustrating an example of the division of a space into elements.
Figure 14:
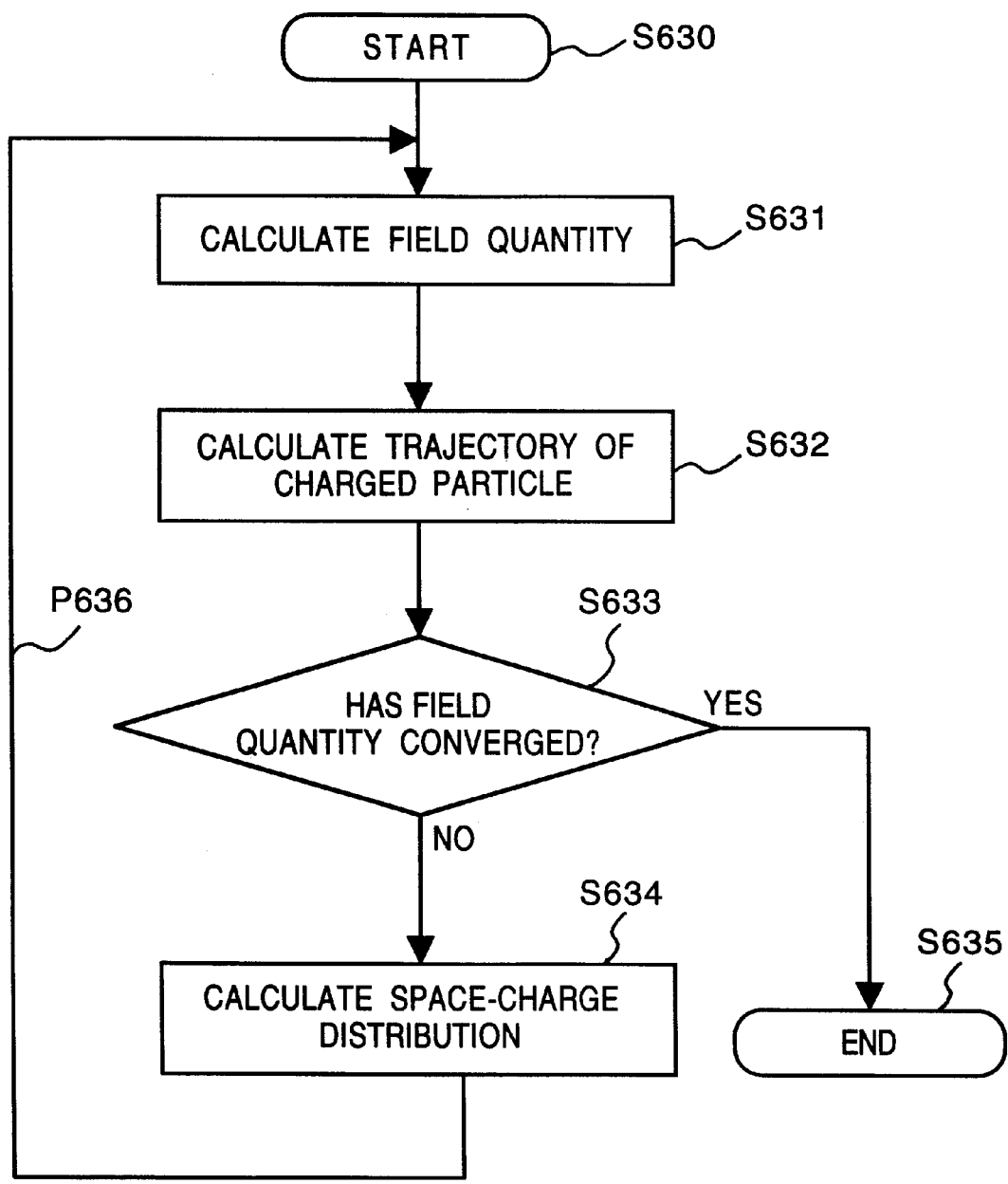
FIG. 14 is a flowchart for illustrating a procedure for calculating the space-charge effect in the conventional device.

This configuration of the system is similar to that of the example of the conventional device of FIG. 10. However, the finite element method is applied to all of the four substructures, while the finite element method is applied only to the first substructure and the boundary element method is applied to the other substructures, namely, the second to fourth substructures in the case of this Embodiment 1.

<Example of Calculation of Electric Field>

Figure 2:
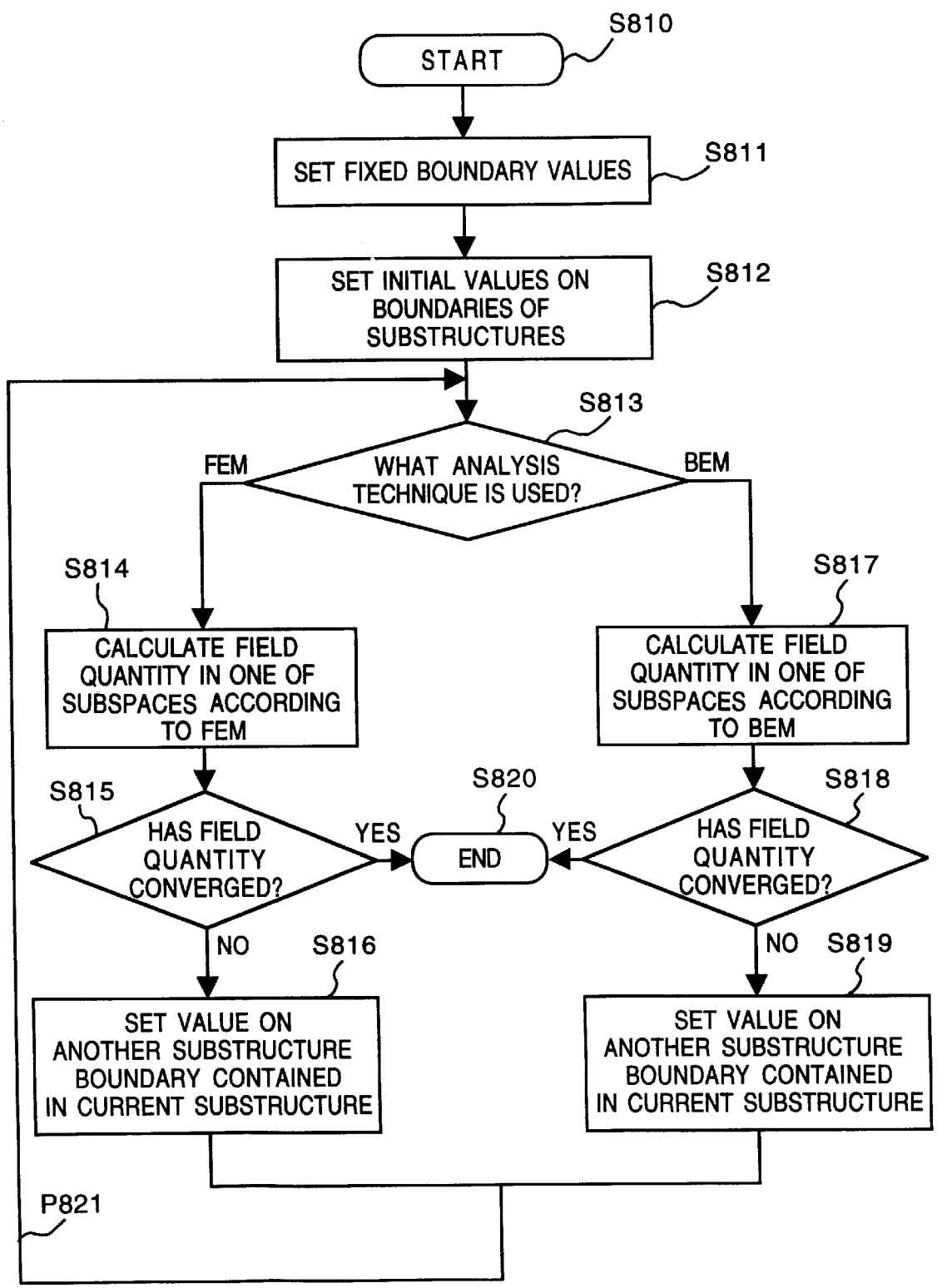
FIG. 2 is a flowchart for illustrating a procedure for calculating an electric field in the case of Embodiment 1 of the present invention.

FIG. 2 is a flowchart for illustrating a procedure for calculating an electric field. Hereinafter, the procedure for calculating an electric field will be described by referring to the flowchart of FIG. 2.

The calculation is started in step S810.

Then, in step S811, fixed boundary values, namely, the values of the potentials are set on the electrodes 101, 105, 106 and 141 to 149 as the fixed boundary conditions. Further, regarding the outer boundaries 123 to 125, zero is given to the value of the normal derivative of the potential thereon, which serves as the fixed boundary condition. Incidentally, the outer boundaries 121 and 122 are contained in the space to be analyzed by the finite element method. Thus, the outer boundaries 121 and 122 are natural boundaries (namely, natural boundary conditions should be met on these boundaries). Therefore, regarding these outer boundaries, it is unnecessary to designate boundary values.

Next, in step S812, initial values are given to the boundaries 131 to 136 of the substructures. The initial values can be determined similarly as in the case of the conventional device. Namely, the initial value may be zero. Instead, the potential on the electrode in the neighborhood of these boundaries may be given thereto as the initial values. Namely, the potentials on the electrodes 141 to 143 may be given to the boundaries 131 and 132. Incidentally, as will be described later, actually, the initial value on the boundary 131 is not used. Thus, the setting of the initial values can be omitted. It is the same with the boundaries designated by reference numerals 133 and 135.

Subsequently, in step S813, the first substructure is first selected. Moreover, it is determined what analysis method is applied to this substructure. In the case of applying the finite element method (FEM) thereto, the program advances to step S814. In contrast, in the case of applying the boundary element method (BEM), the program advances to step S817.

Because the finite element method is applied to the first substructure of this example, the potential in the first substructure comes to be calculated according to the finite element method (FEM) in step S814. At that time, the fixed boundary conditions are used for the boundaries 101, 106, 141, 142 and 132. Moreover, natural boundary conditions are used for the boundaries 121 and 122.

If it is judged in step S815 that the potential has not converged on a value, the program advances to step S816 whereupon values of potentials are set at a node on the boundary 131 of the second substructure, which is present in the first substructure, according to a result of the calculation of the potential in the first substructure.

Next, the program returns again through the path or branch P821 to step S813 whereupon the program passes or moves on to the calculation of the potential in the next substructure, namely, the second substructure.

Because the boundary element method (BEM) is applied to the second substructure of this example, the potential in the first substructure comes to be calculated according to the boundary element method (BEM) in step S817. In this case, regarding the boundaries 142 to 145, 131 and 134, the values of the potentials are used as the fixed boundary conditions. Moreover, regarding the boundary 123, the value (namely, zero) of the normal derivative of the potential is used as the fixed boundary conditions. Furthermore, let the normal derivatives of the potentials on the boundaries 142 to 145, 131 and 134 and the value of the potential on the boundary 123 be unknown quantities. Thus the calculation is performed so as to find the unknown quantities.

If it is judged in step S818 that the potential has not converged on a value, the program advances to step S819 whereupon values of potentials at nodes on the boundary 132 of the first substructure and the boundary 133 of the third substructure are calculated according to a result of the calculation of the potential in the second substructure.

Thence, such calculation is performed on the third and fourth substructures in sequence. Upon completion of the calculation of the potentials and so forth on all of the substructures, the program returns again to step S813 through the path or branch P821. Subsequently, the calculation of the potential on the first substructure. Thence, similar operations are repeatedly performed.

In the aforementioned repeated process, it is judged in step S815 or S818 whether or not the value has converged. In the case of performing the calculation on the first substructure to which the finite element method is applied, the convergence is judged as being achieved, if the potential at the element node therein becomes unchanged even when the calculation is repeatedly performed through the path P821. In contrast, in the case of performing the calculation on the second substructure to which the boundary element method is applied, the convergence is judged as being achieved, if the value of the potential and the value of the normal derivative of the potential at the boundary node therein become unchanged even when the calculation is repeatedly performed through the path P821. When such convergence is attained correspondingly to all of the substructures, the program advances to step S820 whereupon the calculation is finished.

<Example of Calculation of Trajectory>

Next, the procedure for calculating a trajectory will be described hereinbelow. Incidentally, there are two kinds of methods (hereunder sometimes referred to as first and second methods) for calculating trajectories.

(Trajectory Calculation I)

Figure 4:
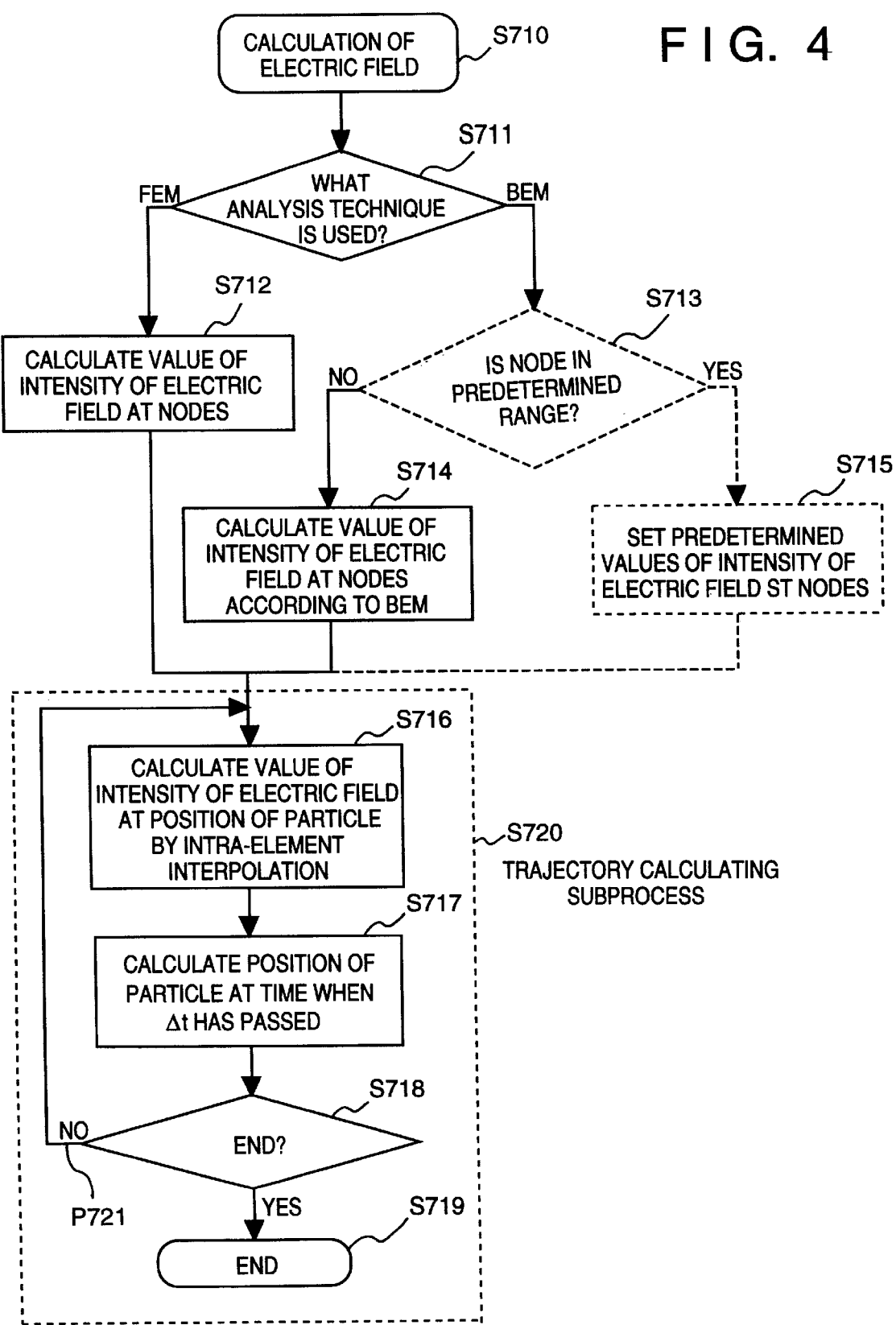
FIG. 4 is a flowchart for illustrating the procedure of a first trajectory calculating method employed in Embodiments 1 and 2 of the present invention.

Hereinafter, the procedure for calculating a trajectory according to the first method will be described by referring to a flowchart of FIG. 4.

(i) When the calculation of the electric field performed in step S710 is finished, (ii) the potentials at the element nodes have been obtained in the first substructure on which the calculation is performed according to the finite element method. Thus the value of (the intensity of) the electric field at the node is computed from this information in step S712. This method for the calculation can be performed similarly as in the case of the conventional method. Namely, there is a method by which the average value of the intensities of the electric field in an element containing the node is employed as the value of the intensity of the electric field at the node.

(iii) In the second to fourth substructures, on which the calculation has been performed according to the boundary element method, the potentials on the boundaries and the values of the normal derivatives of the potentials thereon have been obtained. Thus, for the purpose of performing the calculation of a trajectory similarly as in the substructure or subspace to which the finite element method is applied, the interior of each of the second to fourth substructures is divided into volume elements (namely, solid elements). Further, the values of the intensity of the electric field on the nodes corresponding to the elements are calculated in step S714 by using information concerning the boundaries of each of the second to fourth substructures and by following the procedure in the case of employing the boundary element method. Incidentally, operations to be performed in steps S713 and S715 of FIG. 4 will be described later in connection with Embodiment 2.

(iv) In steps S712 and S714, the entire space to be analyzed is divided into volume elements and subsequently, the values of the electric field at all nodes therein are obtained. Therefore, the subsequent calculation of a trajectory can be performed in a trajectory calculating subprocess S720 (consisting of steps S716 to S719), similarly as in the case of the conventional method.

(v) Namely, the process of the calculation of a trajectory consists of a subprocess, in which the value of the intensity of the electric field at the position of a particle is calculated in step S716 by using intra-element interpolation, and a subprocess in which the position and speed of the particle at the time when an infinitesimal period $\Delta t$ has passed thence are calculated in step S717 by solving an equation of motion. Further, this process is repeatedly performed through the path or branch P721 until the particle reaches the final position. Moreover, this process is repeatedly performed in the cases of all particles. Upon completion of the repetition of this process concerning all particles, this is judged in step S718. Then, the program advances to step S719 whereupon the calculation is finished.

(Trajectory Calculation II)

Hereinafter, the procedure for calculating a trajectory according to the second method will be described by referring to a flowchart of FIG. 5.

(i) When the calculation of the electric field performed in step S730 is finished, this process is commenced. This is similar to step S710 of FIG. 4.

(ii) In the case where the calculation is performed on the substructure in step S730 according to the finite element method, this is judged in step S731. Further, in the next step S732, the values of the intensity of the electric field at the nodes are calculated. In the case where the calculation is performed on the substructure in step S730 according to the boundary element method, the program directly advances to step S741 without performing calculation.

(iii) The calculation of a trajectory is performed in the subprocess S741 (consisting of steps S733 to S740). First, in step S733, an operation to be performed in the next step is determined according to an analysis technique to be used for calculating an electric field in the substructure.

(iv) In the case where the calculation is performed on the substructure in step S730 according to the finite element method, the program advances to step S734 whereupon the electric field at the position of a particle is calculated by intra-element interpolation.

(v) In the case where the calculation is performed on the substructure in step S730 according to the boundary element method, the program advances to step S736 whereupon the electric field at the position of a particle is calculated by using the potentials on the boundaries and the values of the normal derivatives of the potentials and by following the procedure of the boundary element method. Incidentally, operations to be performed in steps S735 and S737 of FIG. 5 will be described later in connection with Embodiment 2.

(vi) In step S738, the position and speed of the particle at the time when an infinitesimal period $\Delta t$ has passed thence are calculated.

(vii) Thereafter, the process described hereinabove is repeatedly performed through the path or branch P742. This process is similar to the first method of calculating a trajectory. Moreover, it is judged in step S739 whether or not the calculation repeatedly performed on all particles is completed. Upon completion of the repetition of this process concerning all particles, the program advances to step S740 whereupon the calculation is finished.

In the case of the aforementioned Embodiment 1, the finite element method is applied to the subspaces 201 and 202 of the first substructure having the electron emitting portion 107 of FIG. 3. Thereby, the value of (the intensity of) the electric field in the vicinity of the emitting surface can be stably calculated. Further, the space-charge effect can be easily taken into account.

On the other hand, the boundary element method is applied to the subspaces 202 to 207 of the second to fourth substructures. Thereby, the electric field can be calculated with good accuracy. In these subspaces, the space-charge effect is negligible. Further, a medium is homogeneous. Thus, these subspaces are suitable for the boundary element method. Consequently, all of the advantages of the boundary element method can be obtained.

Incidentally, in the case of the first method for calculating a trajectory, a computation time required for calculating the value of (the intensity of) the electric field at the position of a particle is short. The first method, thus, has an advantage in that the calculation of a trajectory can be performed at a high speed. Moreover, in the substructures to which the boundary element method is applied, the electric field at the position of a node can be calculated more accurately than the case of calculating the electric field according to the finite element method. Thus, even in the case where the electric field at points other than the nodes is obtained by performing intra-element interpolation, the value (of the intensity) of the electric field at the position of a particle can be calculated with good precision. Further, the first method for calculating a trajectory has an advantage in that the computation time can be shortened in the case where the number of particles to be calculated is large and the calculation of the trajectory of a particle should be repeatedly performed a large number of times.

Figure 5:
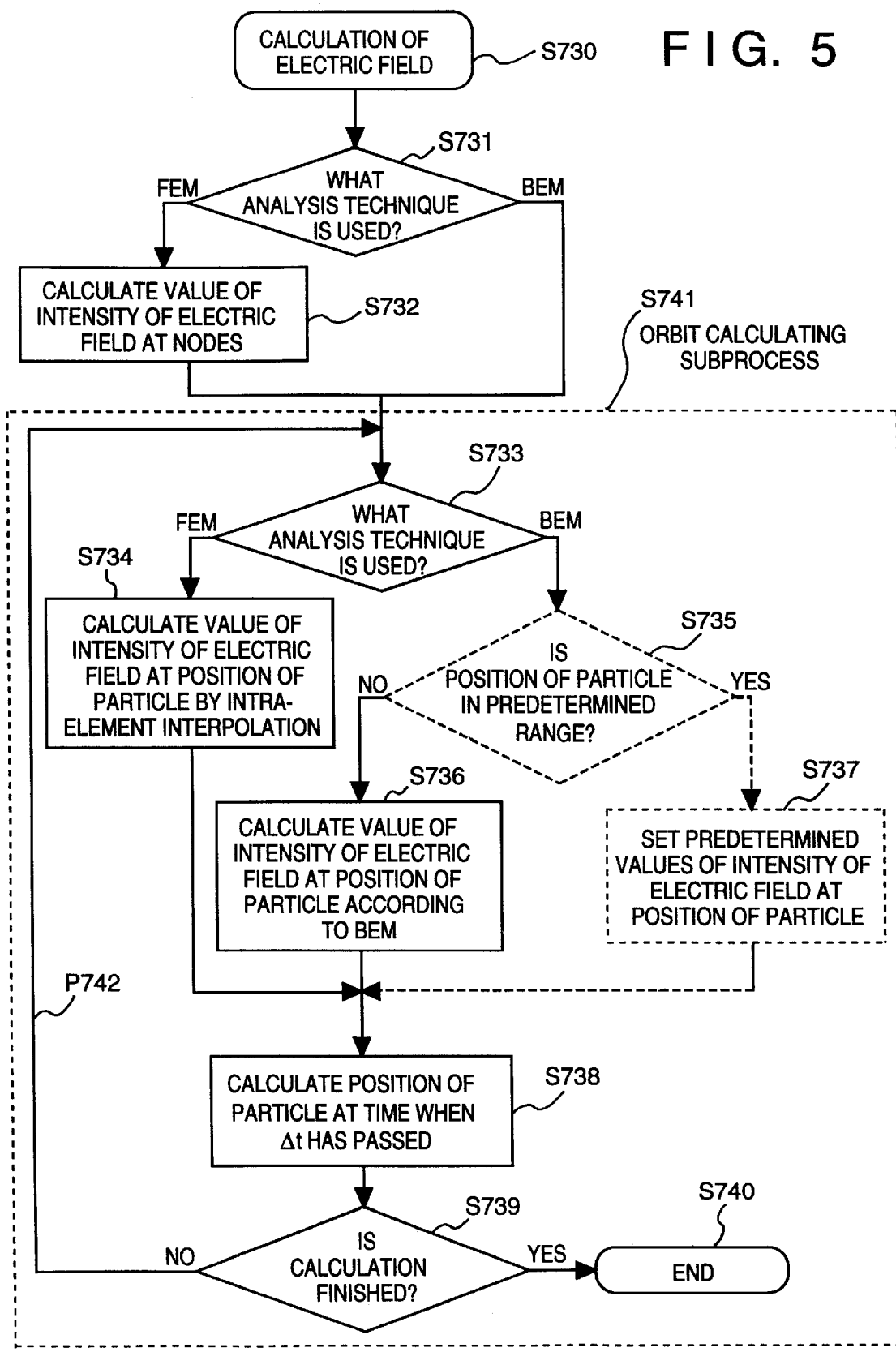
FIG. 5 is a flowchart for illustrating the procedure of a second trajectory calculating method employed in Embodiments 1 and 2 of the present invention.

In the case of the second method for calculating a trajectory, the calculation procedure of which is illustrated in FIG. 5, the electric field at the position of a particle is directly calculated by following the procedure of the boundary element method. Thus, the second method has an advantage in that the accuracy of calculating a trajectory in the substructure, in which the electric field is calculated according to the boundary element method, is higher in comparison with the first method. Incidentally, integral calculation is performed on all of the boundaries of a substructure, for the calculation of the electric field. Therefore, the second method requires a long computation time to calculate the trajectory of a particle. Consequently, this method is suitable for the case where the number of particles to be calculated is small and the number of repetitions of the calculation of the trajectory of a particle is small.

Hereunder, a computation time required by the substructuring method employed in this embodiment of the present invention will be described.

First, a process for obtaining a solution, which corresponds to the entire space to be analyzed, will be described hereinbelow. When performing the calculation on a substructure used in the substructuring method, the number of kinds of unknown quantities is small and the computation time is short in comparison with the case where the calculation is performed on the entire space at a time. Namely, the computation time is proportional to the square of the number of kinds of unknown quantities. Thus, in the case where the entire space to be analyzed is divided into four substructures, the number of kinds of unknown quantities per substructure is reduced by a factor of four. Consequently, the computation time decreases by a factor of sixteen. A total of the computation periods of time respectively corresponding to the four substructures decreases by a factor of four (namely, $(\frac{1}{16}) \times 4 = \frac{1}{4}$). In the case of performing the substructuring method, iterative calculation is required for achieving the convergence. However, if the number of repetitions of the calculation is not more than four, the substructuring method of this embodiment has an advantage in that the computation time for finding a solution is shorter than that in the case of the conventional method.

Incidentally, memory or storage capacity required for performing the calculation on a substructure is sufficient for performing the calculation on the entire space to be analyzed. Generally, the storage capacity required for performing the calculation is proportional to the square of the number of kinds of unknown quantities. Thus, the substructuring method of this embodiment of the present invention has an advantage in that the used memory capacity (namely, the necessary storage capacity) can be saved considerably.

Next, a computation time required for calculating an electric field at a given point will be described hereinbelow. In the case of the boundary element method, the calculation of an electric field at an arbitrary position is performed by integrating a predetermined function on boundary elements. Therefore, the computation time required for calculating an electric field is proportional to the length of the boundary. In the case of performing such a calculation on a substructure established by the substructuring method, the domain of integration becomes small in comparison with the case of performing such a calculation on the entire space to be analyzed. This results in decrease in the computation time. In the case of this embodiment, the subspaces 202 to 207 are divided into (or assigned to) three substructures. Thus, the range of a boundary to be integrated is reduced by a factor of three or so. Consequently, the computation time is also decreased by a factor of three. In accordance with the first method for calculating a trajectory, a time required for calculating an electric field at nodes in step S714 of FIG. 4 can be shortened. Further, in accordance with the second method for calculating a trajectory, a time required for calculating an electric field at the position of a particle in step S736 of FIG. 5 can be shortened. Especially, in the case of the second method for calculating a trajectory, most of a computation time required for calculating a trajectory in a boundary element subspace is a time required for calculating an electric field. Consequently, the second method has an effect in that the computation time required for calculating a trajectory can be reduced in inverse proportion to the number of the substructures.

Incidentally, in the case of Embodiment 1, as described in the analysis procedure of FIG. 2, the iterative calculation is performed through the path or branch P821. In the cases of some analyzing systems, this iterative process can be omitted. Namely, in the case where the subspaces 202, 204 and 206 of FIG. 3 are sufficiently thin in the direction of width perpendicular to the axis α-β, the mutual interaction between each pair of the electric field distributions formed in the subspaces 201, 203, 205 and 207, respectively, is negligible. Thus, sometimes, the electric field distributions are formed in the subspaces 201, 203, 205 and 207, respectively, independent of one another. In such cases, the subprocess or path P821 of FIG. 2 has only to be performed one time correspondingly to each of the first to fourth substructures. Thus, this subprocess P821 of FIG. 2 has only to be repeated four times.

Incidentally, in this case, the values to be set on the substructure boundaries 131 to 136 in the path or subprocess P821 are not zero. The values of the potentials on the electrodes, with which the boundaries comes into contact, should be set thereto. For instance, in the case where the calculation is performed on the fist substructure consisting of the subspaces 201 and 202, the values of the potentials on the electrodes 141 to 143 are set (at nodes) on the boundary 132. Further, in the case where the calculation is performed on the second substructure consisting of the subspaces 202 and 204, the values of the potentials on the electrodes 144 to 146 are set (at nodes) on the boundary 134. On the other hand, a value obtained as the result of the calculation performed on the first substructure may be given onto the boundary 131. Alternatively, regardless of the calculation performed on the first substructure, the values of the potentials on the electrodes 141 to 143 may be given to the boundary 131.

Figure 6:
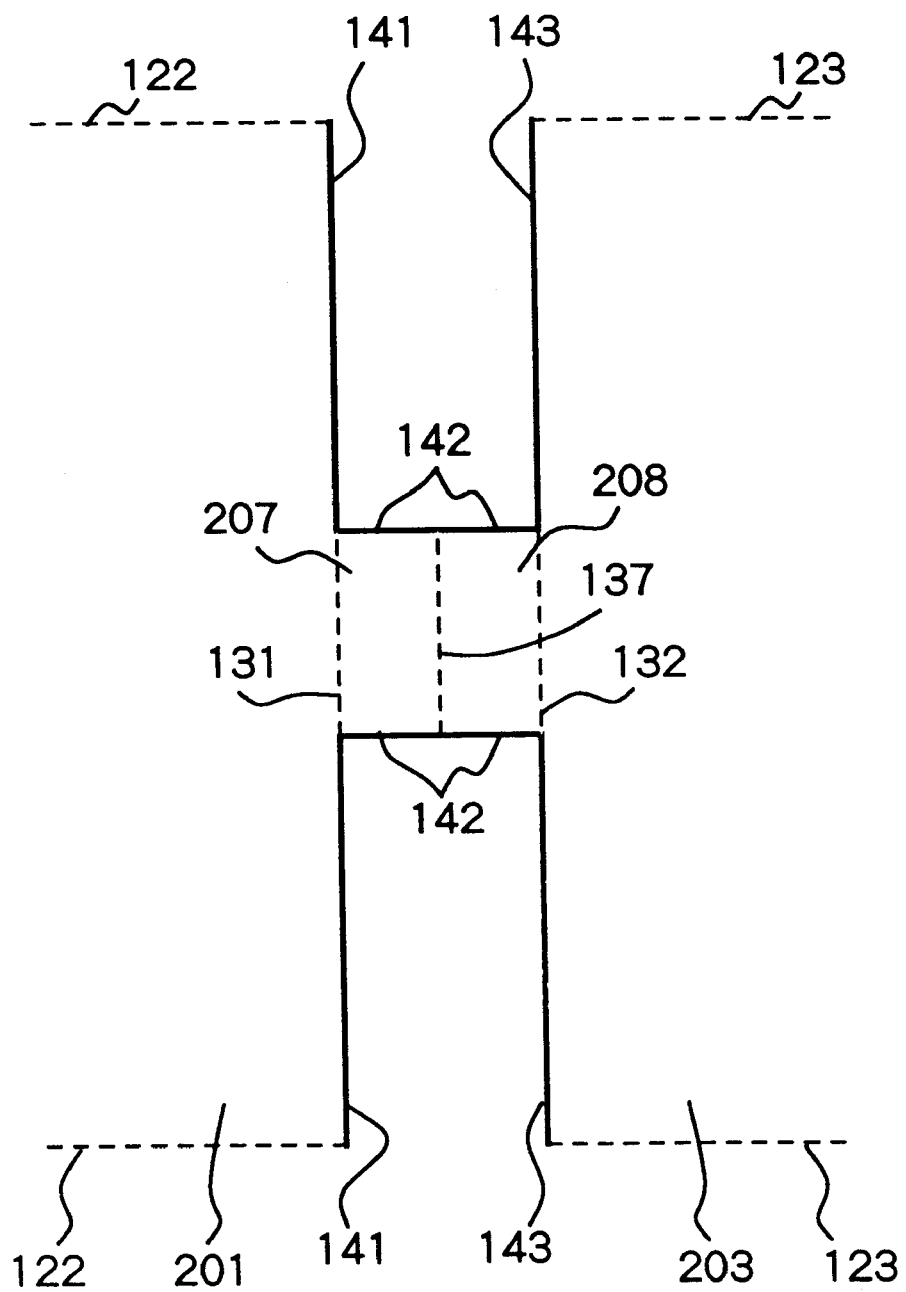
FIG. 6 is an enlarged view of an overlapping portion or subspace between adjoining substructures.

Each of the overlapping portions or subspaces 202, 204 and 206 between the adjoining substructures belong to both of the adjoining substructures. Thus, in the case of calculating the electric fields in these subspaces, the system or device may use either of these subspaces. This will be described hereinbelow by referring to FIG. 6. FIG. 6 is an enlarged view of a part of the overlapping subspaces of FIG. 3. As shown in FIG. 6, the overlapping subspace 202 of FIG. 3 is partitioned by a plane 137 into subspaces 207 and 208. The line 137 is provided in the vicinity of the midway portion between the boundaries 131 and 132. In one of the overlapping spaces 207, the calculation of an electric field is calculated on the basis of the first substructure. On the other hand, in another overlapping space 208, the calculation of an electric field is calculated on the basis of the second substructure. Thus, in each of the substructures, only one or more subspaces thereof, which have good accuracy of calculating a field quantity can be utilized. Consequently, the calculation can be achieved with good precision.

<Embodiment 2>

Hereinafter, another embodiment of the present invention, namely, Embodiment 2 will be described, Further, the process of calculating an electric field in Embodiment 2 is similar to that of calculating an electric field in Embodiment 1, which has been previously described by referring to FIG. 2. Incidentally, Embodiment 2 is different from Embodiment 1 in the process of calculating the trajectory of a charged particle. Thus, the process of calculating the trajectory of a charged particle in Embodiment 2 will be described hereinbelow.

(Trajectory Calculation Process I)

First trajectory calculation process of this embodiment will be described hereunder by referring to a flowchart of FIG. 4. The difference between the trajectory calculation processes of Embodiment 2 and Embodiment 1 is a subprocess consisting of steps S713 and S715 designated by dashed lines in FIG. 4. Namely, in the case where the calculation of the value of (intensity of) an electric field at nodes in a substructure, in which such calculation is carried out according to the boundary element method, is performed, nodes located in a predetermined range are first discriminated in step S713. Then, predetermined values are given to such nodes in step S715. Practically, zero is given to nodes on the β-side of a plane 138 of FIG. 3 as the value of (intensity of) an electric field.

(Trajectory Calculation Process II)

Second trajectory calculation process of this embodiment will be described hereunder by referring to a flowchart of FIG. 5. The difference between the trajectory calculation processes of Embodiment 2 and Embodiment 1 is a subprocess consisting of steps S735 and S737 designated by dashed lines in FIG. 5. Namely, in the case where the calculation of the value of (intensity of) an electric field at the position of a particle, the electric field is calculated in a subspace or part on the α-side of the line 138 of FIG. 3, similarly as in the case of Embodiment 1. However, the electric field is not calculated in a subspace or part on the β-side of the plane 138 of FIG. 3 and instead, zeros are given thereto as the values of (intensity of) the electric field.

Further, the characteristic features of Embodiment 2 reside in the following aspects:

(1) In the configuration of FIG. 3, a same voltage is sometimes provided to the electrodes 144 to 146, 147 to 149 and 105. In such a case, the intensity of the electric field becomes zero in the subspaces 205 to 207 except for the proximity of the boundary 134. Therefore, the calculation of the electric field can be omitted in a subspace or part on the β-side of the plane 138 which is away from the boundary 134. Consequently, Embodiment 2 has an advantage in that the computation time can be further shortened.

(2) Further, although FIG. 3 schematically illustrates the configuration of an analysis model employed in this embodiment, the length of a practical system in the direction along the axis α-β is sometimes about 100 times as long as that in the direction perpendicular the axis α-β thereof. However, in the case of the boundary element method, the accuracy of calculating a field quantity at a point in the vicinity of a boundary is low if the distance of the point from the boundary is not more than the size of a boundary element. It is thus necessary for preventing an error from occurring due to this low accuracy to reduce the size of each boundary element. Therefore, an extremely large number of boundary elements are needed. Consequently, such a system has encountered the problem that the computation time increases. This embodiment, however, has advantages in that unnecessary calculation can be omitted and an occurrence of an error can be prevented.

(3) Furthermore, in the case of Embodiment 2, the calculation of an electric field corresponding to the fourth substructure can be omitted.

To describe more precisely about this item (3), a subspace or part, which is on the β-side of the plane 138, of the third substructure consisting of the subspaces 204 to 206 of FIG. 3 is not always necessary. Therefore, another plane 139 can be provided on the plane 138 or to the β-side of the plane 138 and moreover, a subspace on the β-side of the plane 139 can be removed from the third substructure. In this case, the line 139 comes to form a boundary of the third substructure. Thereby, the computation time is further reduced. Incidentally, generally, it is desired that a spacing, which has a width corresponding to, for example, the size of a boundary element, is provided between the planes 139 and 138 (namely, the distance therebetween should be equal to the size of a boundary element). Consequently, the evil influence of the low accuracy of calculating an electric field according to the boundary element method in the vicinity of the boundary can be eliminated. Moreover, only values calculated in the subspaces, whose accuracy of calculating the electric field is good, can be used.

<Embodiment 3>

Hereinafter, another embodiment of the present invention, namely, Embodiment 3 will be described by referring to FIGS. 7 and 8.

Figure 7:
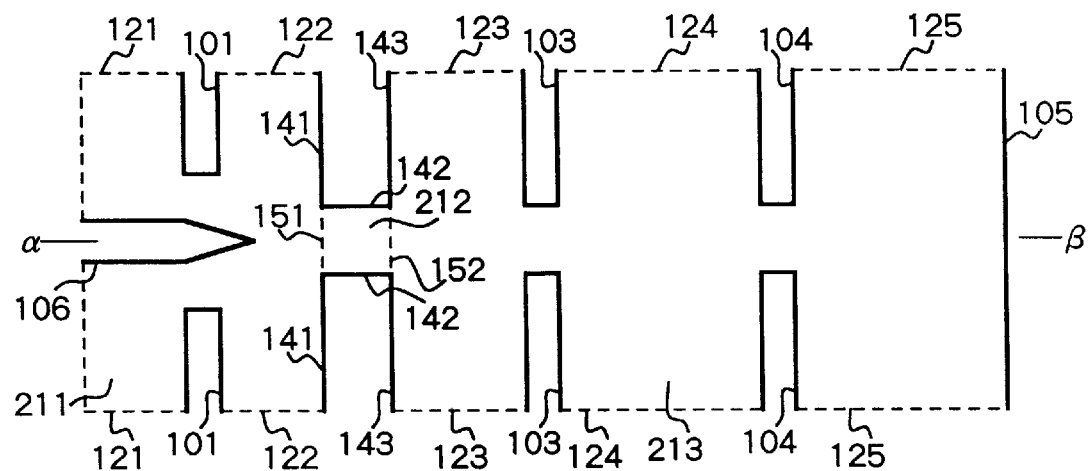
FIG. 7 is a diagram for illustrating an analysis model employed in Embodiment 3 of the present invention.

FIG. 7 is a diagram for illustrating an example of the system provided in the electron beam device of the present invention. In this figure, reference numerals 101, 103 to 106 and 141 to 143 designate electrodes. In Embodiment 3, a space to be analyzed consists of subspaces 211 to 213, and these subspaces 211 to 213 are assigned to two substructures (namely, first and second substructures).

The first substructure consists of the subspaces 211 and 212 and has boundaries 101, 141, 142, 152, 106, 121 and 122.

Further, the second substructure consists of the subspaces 212 and 213 and has boundaries 142, 143, 103 to 105, 123 to 125 and 151. An electric-field analysis is made in the first substructure by performing a three-dimensional analysis based on the finite element method. Further, an electric-field analysis is made in the second substructure by performing an axisymmetric analysis based on the boundary element method.

Figure 8:
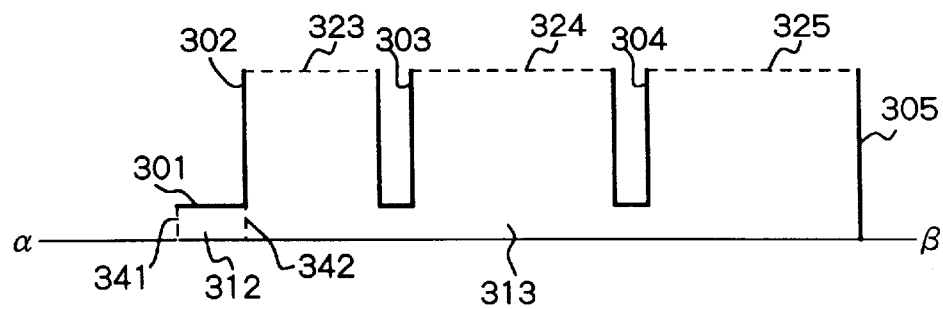
FIG. 8 is a diagram for illustrating an axisymmetric space to be analyzed in Embodiment 3 of the present invention.
Figure 9:
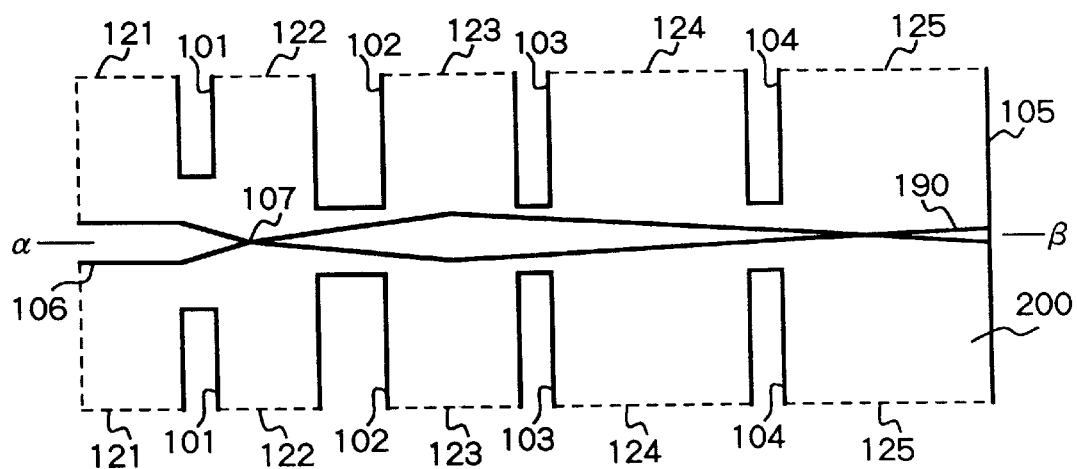
FIG. 9 is a schematic sectional diagram for illustrating an electron beam device.

FIG. 8 illustrates axisymmetric analysis spaces 312 and 313 of the second substructure. In this figure, reference numerals 301 to 305 designate electrodes; 323 to 325 outer boundaries; and 341 a substructure boundary. Further, reference numeral 342 denotes a substructure boundary of the first substructure.

Moreover, the characteristic features of Embodiment 3 reside in the following aspects:

(1) The system of FIG. 7 often has an axisymmetric configuration of the electrodes. However, problems frequently occur in the cases that the shape of a tip portion of the electrode 106 for emitting electrons is asymmetric and that the position and orientation of the electrode 106 are off (namely, deviate from) an axis of symmetry $\alpha$-$\beta$. In such cases, the subspace 211 of FIG. 7 is asymmetric, while the subspaces 212 and 213 are perfectly axisymmetric. Moreover, in the subspaces 212 and 213, the space-charge effect is negligible. Even if the trajectory of an electron is asymmetric, the electric field distribution is perfectly axisymmetric. Therefore, the computational complexity can be considerably decreased by applying an axisymmetric calculation on the electric field analysis performed on the second substructure, in comparison with the cases of performing a three-dimensional analysis similarly as in the cases of Embodiments 1 and 2.

(2) Strictly speaking, the boundary 341 placed in a connection portion between the first and second substructures does not meet axisymmetry, because a three-dimensional analysis is performed on the first substructure. However, the extent of deviation from the axisymmetry is negligible. Therefore, the value of a field quantity corresponding to an appropriate angle of rotation around the axis of symmetry $\alpha$-$\beta$ may be selected and used.

(3) Further, results of the calculation performed on the first substructure may be averaged in the direction of rotation. Moreover, an average value obtained in this way maybe used.

Incidentally, this embodiment has the two substructures. However, the second substructure consisting of the subspaces 212 and 213 of FIG. 7 may be further divided into three substructures, similarly as in the cases of the first and second embodiments (namely, Embodiments 1 and 2). In this case, Embodiment 3 can further obtain advantages in that the computation time is shortened and the used memory is reduced, similarly as in the case of the first embodiment.

In the foregoing description, the cases, in which the embodiments of the present invention are applied to the calculation of the electric field, have been described. The application of the present invention is not limited thereto. It is apparent that the present invention can be applied to the calculation of another field quantity, for example, the calculation of a magnetic field and a stress-deformation calculation.

<Other Embodiment>

The present invention can be applied to a system constituted by a plurality of devices (e.g., host computer, interface, reader, printer) or to an apparatus comprising a single device.

Further, the object of the present invention can be also achieved by providing a storage medium storing program codes for performing the aforesaid processes to a system or an apparatus, reading the program codes with a computer (e.g., CPU, MPU) of the system or apparatus from the storage medium, then executing the program.

In this case, the program codes read from the storage medium realize the functions according to the embodiments, and the storage medium storing the program codes constitutes the invention.

Further, the storage medium, such as a floppy disk, a hard disk, an optical disk, a magneto-optical disk, CD-ROM, CD-R, a magnetic tape, a non-volatile type memory card, and ROM can be used for providing the program codes.

Furthermore, besides aforesaid functions according to the above embodiments are realized by executing the program codes which are read by a computer, the present invention includes a case where an OS or the like working on the computer performs a part or entire processes in accordance with designations of the program codes and realizes functions according to the above embodiments.

Furthermore, the present invention also includes a case where, after the program codes read from the storage medium are written in a function extension board which is inserted into the computer or in a memory provided in a function extension unit which is connected to the computer, CPU or the like contained in the function extension board or unit performs a part or entire process in accordance with designations of the program codes and realizes functions of the above embodiments.

In a case where the present invention is applied to the aforesaid storage medium, the storage medium stores program codes corresponding to the flowcharts described in the embodiments. Briefly, the storage medium stores each module shown as an example of a memory map in the external storage 7 of FIG. 1. More specifically, program codes which correspond to substructing methods module, selecting method module, and determining solution module, at least, are to be stored in the storage medium.

As described above, the present invention can obtain effects that the accuracy of calculation can be enhanced and simultaneously, the computation time can be shortened, as the result of employing a technique suitable for each substructure as a method for calculating a field quantity.

Further, the present invention has advantages in that the calculation for predicting, for example, a trajectory of a charged particle, which requires high accuracy, can be achieved by performing a relatively small scale analysis.

Moreover, the present invention further has another advantage in that the calculation of a field quantity in the vicinity of a boundary can be achieved with good accuracy, in contrast with the conventional system which performs such calculation in the vicinity of the boundary with degraded accuracy.

Although the preferred embodiments of the present invention have been described above, it should be understood that the present invention is not limited thereto and that other modifications will be apparent to those skilled in the art without departing from the spirit of the invention.

The scope of the present invention, therefore, should be determined solely by the appended claims.

What is claimed is:

1. A substructuring method for obtaining a solution for a structure to be analyzed, comprising the steps of:
   dividing the structure into two or more substructures;
   preparing at least two different calculation techniques for calculating a solution for each of the substructures from boundary conditions;
   selecting one of the at least two calculation techniques separately for each of the substructures according to characteristics of analysis conditions corresponding to each of the substructures;
   separately calculating a solution for each of the substructures according to boundary conditions by using the selected calculation technique, until the solutions for all of the substructures fall within respective ranges, each range being predetermined in accordance with each of the substructures; and
   determining a set of the solutions of the substructures obtained in said calculating step as the solution for the structure.

2. The substructuring method according to claim 1, wherein the structure is divided into the substructures in such a manner that there is an overlapping portion between adjoining ones of the substructures.

3. The substructuring method according to claim 2, wherein the calculating of the solution corresponding to each of the substructures is performed by computing a boundary value of the field quantity on a boundary of the substructure, which is placed in the structure, from values thereof obtained in adjoining portions which contain the boundary of the substructure, wherein the determining of the solution corresponding to the structure is carried out by repeatedly performing calculation of values of the field quantity in the substructure by using values obtained from a result of the computing as boundary values on boundaries of the portions, thereby obtaining a solution for the boundary value of the substructure in the structure.

4. The substructuring method according to claim 1, wherein the different calculation techniques include a finite element method and a boundary element method.

5. The substructuring method according to claim 1, wherein the different calculation techniques include a three-dimensional analysis technique and an axisymmetric three-dimensional analysis technique.

6. The substructuring method according to claim 1, wherein the calculating of the solution corresponding to each of the substructures is performed by setting a predetermined value in at least one of the substructures or in a part of the substructures.

7. The substructuring method according to claim 1, which is used for calculating a trajectory of a charged particle.

8. A system for obtaining a solution for a structure to be analyzed, comprises:
   dividing means for dividing the structure into two or more substructures;
   at least two different calculation means for calculating a solution for each of the substructures from boundary conditions;
   selecting means for selecting one of the at least two calculation means separately for each of the substructures, according to characteristics of analysis conditions corresponding to each of the substructures;
   driving means for driving the selected calculation means using boundary conditions to separately calculate a solution for each of the substructures, until the solutions for all of the substructures fall within respective ranges, each range being predetermined in accordance with each of the substructures; and
   determination means for determining a set of the solutions of the substructures obtained by the driving of said calculation means as the solution for the structure.

9. The system according to claim 8, wherein the substructure calculating means comprises:
   boundary potential determining means for setting a potential on a fixed boundary and for determining a potential which is present on a boundary of one of the substructure;
   electric-field determining means for determining an electric field according to the potential set on the fixed boundary and the potential being present on the boundary of the substructure; and
   trajectory calculating means for calculating a trajectory of a charged particle according to information concerning the electric field and the charged particle, thereby calculating the trajectory of the charged particle in an electronic or ion-beam device.

10. The system according to claim 8, wherein the electric-field determining means determines an electric field according to the potential set on the fixed boundary, the determined potential on the boundary of the substructure and an electric charge of the charged particle.

11. A computer program product system, provided with a computer usable medium, for obtaining a resolution for a structure to be analyzed, comprising:
   first computer readable program code means, embodied in the medium, for dividing the structure into two or more substructures;
   second computer readable program code means, embodied in the medium, for performing at least two different calculation techniques to calculate a solution for each of the substructures from boundary conditions;
   third computer readable program code means, embodied in the medium, for selecting one of the at least two calculation techniques separately for each of the substructures according to characteristics of analysis conditions corresponding to each of the substructures;
   fourth computer readable program code means, embodied in the medium, for separately calculating a solution for each of the substructures according to boundary conditions by using the selected calculation technique, until the solutions for all of the substructures fall within respective ranges, each range being predetermined in accordance with each of the substructures; and
   fifth computer readable program code means, embodied in the medium, for determining a set of the solutions of the substructures obtained by executing said fourth computer readable program code means as the solution for the structure.

* * * * *

UNITED STATES PATENT AND TRADEMARK OFFICE
CERTIFICATE OF CORRECTION

PATENT NO. : 5,987,236

DATED : November 16, 1999

INVENTOR(S): KO YONEDA

It is certified that error appears in the above-identified patent and that said Letters Patent is hereby corrected as shown below:

COVER PAGE AT ITEM [56] RC:
Insert: --U.S. Patent Documents--;
--5,224,492 7/1993 Takahashi et al.--;
--5,315,233 5/1994 Sakiyama et al.--; and
--5,623,425 4/1997 Toda--.

SHEET 4:
Figure 4, "ST" should read --AT--.

COLUMN 8:
Line 67, "and" should read --or--.

COLUMN 11:
Line 12, after "substructure" insert --is performed--.

COLUMN 14:
Line 65, "correspondingly" should read --corresponding--.

COLUMN 15:
Line 6, "fist" should read --first--.

UNITED STATES PATENT AND TRADEMARK OFFICE
CERTIFICATE OF CORRECTION

PATENT NO. : 5,987,236

DATED : November 16, 1999

INVENTOR(S): KO YONEDA

It is certified that error appears in the above-identified patent and that said Letters Patent is hereby corrected as shown below:

COLUMN 17:
Line 53, "maybe" should read --may be--.

Signed and Sealed this

Ninth Day of January, 2001

Attest:

Q. TODD DICKINSON

*Attesting Officer*  *Commissioner of Patents and Trademarks*